United States Patent
Ko et al.

(10) Patent No.: US 8,629,478 B2
(45) Date of Patent: Jan. 14, 2014

(54) FIN STRUCTURE FOR HIGH MOBILITY MULTIPLE-GATE TRANSISTOR

(75) Inventors: Chih-Hsin Ko, Fongshan (TW); Clement Hsingjen Wann, Carmel, NY (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 398 days.

(21) Appl. No.: 12/797,839

(22) Filed: Jun. 10, 2010

(65) Prior Publication Data

US 2011/0024794 A1 Feb. 3, 2011

Related U.S. Application Data

(60) Provisional application No. 61/230,403, filed on Jul. 31, 2009.

(51) Int. Cl.
*H01L 29/76* (2006.01)

(52) U.S. Cl.
USPC .......... 257/192; 257/200; 257/E29.179; 257/E29.081; 257/E21.093

(58) Field of Classification Search
None
See application file for complete search history.

(56) References Cited

U.S. PATENT DOCUMENTS

| | | | |
|---|---|---|---|
| 5,581,202 A | 12/1996 | Yano et al. | |
| 5,658,417 A | 8/1997 | Watanabe et al. | |
| 5,767,732 A | 6/1998 | Lee et al. | |
| 5,949,986 A | 9/1999 | Riley et al. | |
| 5,963,789 A | 10/1999 | Tsuchiaki | |
| 6,065,481 A | 5/2000 | Fayfield et al. | |
| 6,121,786 A | 9/2000 | Yamagami et al. | |
| 6,299,724 B1 | 10/2001 | Fayfield et al. | |
| 6,455,377 B1 | 9/2002 | Zheng et al. | |
| 6,503,794 B1 | 1/2003 | Watanabe et al. | |

(Continued)

FOREIGN PATENT DOCUMENTS

| | | |
|---|---|---|
| CN | 1945829 | 4/2004 |
| CN | 1542966 | 11/2004 |

(Continued)

OTHER PUBLICATIONS

Anathan, Hari, et al., "FinFet SRAM—Device and Circuit Design Considerations", Quality Electronic Design, 2004, Proceedings 5th International Symposium (2004); pp. 511-516.

(Continued)

*Primary Examiner* — Fei Fei Yeung Lopez
(74) *Attorney, Agent, or Firm* — Lowe Hauptman & Ham, LLP

(57) ABSTRACT

A vertical fin structure for a semiconductor transistor includes a semiconductor substrate, a fin layer on top of the substrate, a capping layer overlaying the fin layer, wherein the substrate comprises group IV semiconductor material, the fin layer comprises group IV semiconductor material, the capping layer comprises semiconductor compound from group III-V. The fin layer can comprise Ge, SiGe, SiC, or any combinations thereof. The semiconductor substrate can comprise Si, Ge, SiGe, or SiC. The capping layer can comprise GaAs, InGaAs, InAs, InSb, GaSb, GaN, InP, or any combinations thereof. The capping layer can provide more than a 4 percent lattice mismatch with the semiconductor substrate. The fin layer can be located in between shallow trench insulation (STI) layers that provide isolation from adjacent devices. The vertical fin structure can further include a high-k dielectric layer overlaying the capping layer and a metal gate layer overlaying the high-k dielectric layer.

21 Claims, 1 Drawing Sheet

(56) References Cited

U.S. PATENT DOCUMENTS

| | | |
|---|---|---|
| 6,613,634 B2 | 9/2003 | Ootsuka et al. |
| 6,622,738 B2 | 9/2003 | Scovell |
| 6,642,090 B1 | 11/2003 | Fried et al. |
| 6,706,571 B1 | 3/2004 | Yu et al. |
| 6,713,365 B2 | 3/2004 | Lin et al. |
| 6,727,557 B2 | 4/2004 | Takao |
| 6,740,247 B1 | 5/2004 | Han et al. |
| 6,743,673 B2 | 6/2004 | Watanabe et al. |
| 6,762,448 B1 | 7/2004 | Lin et al. |
| 6,774,390 B2 | 8/2004 | Sugiyama et al. |
| 6,791,155 B1 | 9/2004 | Lo et al. |
| 6,828,646 B2 | 12/2004 | Marty et al. |
| 6,830,994 B2 | 12/2004 | Mitsuki et al. |
| 6,858,478 B2 | 2/2005 | Chau et al. |
| 6,872,647 B1 | 3/2005 | Yu et al. |
| 6,940,747 B1 | 9/2005 | Sharma et al. |
| 6,949,768 B1 | 9/2005 | Anderson et al. |
| 6,964,832 B2 | 11/2005 | Moniwa et al. |
| 7,009,273 B2 | 3/2006 | Inoh et al. |
| 7,018,901 B1 | 3/2006 | Thean et al. |
| 7,026,232 B1 | 4/2006 | Koontz et al. |
| 7,067,400 B2 | 6/2006 | Bedell et al. |
| 7,078,312 B1 | 7/2006 | Sutanto et al. |
| 7,084,079 B2 | 8/2006 | Conti et al. |
| 7,084,506 B2 | 8/2006 | Takao |
| 7,112,495 B2 | 9/2006 | Ko et al. |
| 7,153,744 B2 | 12/2006 | Chen et al. |
| 7,157,351 B2 | 1/2007 | Cheng et al. |
| 7,190,050 B2 | 3/2007 | King et al. |
| 7,193,399 B2 | 3/2007 | Aikawa |
| 7,205,604 B2 | 4/2007 | Ouyang et al. |
| 7,247,887 B2 | 7/2007 | King et al. |
| 7,265,008 B2 | 9/2007 | King et al. |
| 7,265,418 B2 | 9/2007 | Yun et al. |
| 7,297,600 B2 | 11/2007 | Oh et al. |
| 7,300,837 B2 | 11/2007 | Chen et al. |
| 7,315,994 B2 | 1/2008 | Aller et al. |
| 7,323,375 B2 | 1/2008 | Yoon et al. |
| 7,338,614 B2 | 3/2008 | Martin et al. |
| 7,351,622 B2 | 4/2008 | Buh et al. |
| 7,358,166 B2 | 4/2008 | Agnello et al. |
| 7,361,563 B2 | 4/2008 | Shin et al. |
| 7,374,986 B2 | 5/2008 | Kim et al. |
| 7,394,116 B2 | 7/2008 | Kim et al. |
| 7,396,710 B2 | 7/2008 | Okuno |
| 7,407,847 B2 | 8/2008 | Doyle et al. |
| 7,410,844 B2 | 8/2008 | Li et al. |
| 7,425,740 B2 | 9/2008 | Liu et al. |
| 7,442,967 B2 | 10/2008 | Ko et al. |
| 7,456,087 B2 | 11/2008 | Cheng |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2 | 5/2009 | Tsai |
| 7,538,391 B2 | 5/2009 | Chidambarrao et al. |
| 7,550,332 B2 | 6/2009 | Yang |
| 7,598,145 B2 | 10/2009 | Damlencourt et al. |
| 7,605,449 B2 | 10/2009 | Liu et al. |
| 7,682,911 B2 | 3/2010 | Jang et al. |
| 7,759,228 B2 | 7/2010 | Sugiyama et al. |
| 7,795,097 B2 | 9/2010 | Pas |
| 7,798,332 B1 | 9/2010 | Brunet |
| 7,820,513 B2 | 10/2010 | Hareland et al. |
| 7,851,865 B2 | 12/2010 | Anderson et al. |
| 7,868,317 B2 | 1/2011 | Yu et al. |
| 7,898,041 B2 | 3/2011 | Radosavljevic et al. |
| 7,923,321 B2 | 4/2011 | Lai et al. |
| 7,923,339 B2 | 4/2011 | Meunier-Beillard et al. |
| 7,960,791 B2 | 6/2011 | Anderson et al. |
| 7,985,633 B2 | 7/2011 | Cai et al. |
| 7,989,846 B2 | 8/2011 | Furuta |
| 7,989,855 B2 | 8/2011 | Narihiro |
| 8,003,466 B2 | 8/2011 | Shi et al. |
| 8,043,920 B2 | 10/2011 | Chan et al. |
| 8,076,189 B2 | 12/2011 | Grant |
| 8,101,475 B2 | 1/2012 | Oh et al. |
| 2002/0144230 A1 | 10/2002 | Rittman |
| 2003/0080361 A1 | 5/2003 | Murthy et al. |
| 2003/0109086 A1 | 6/2003 | Arao |
| 2003/0145299 A1 | 7/2003 | Fried et al. |
| 2003/0234422 A1 | 12/2003 | Wang et al. |
| 2004/0048424 A1 | 3/2004 | Wu et al. |
| 2004/0075121 A1 | 4/2004 | Yu et al. |
| 2004/0129998 A1 | 7/2004 | Inoh et al. |
| 2004/0192067 A1 | 9/2004 | Ghyselen et al. |
| 2004/0219722 A1 | 11/2004 | Pham et al. |
| 2004/0259315 A1 | 12/2004 | Sakaguchi et al. |
| 2005/0020020 A1 | 1/2005 | Collaert et al. |
| 2005/0051865 A1 | 3/2005 | Lee et al. |
| 2005/0082616 A1 | 4/2005 | Chen et al. |
| 2005/0153490 A1 | 7/2005 | Yoon et al. |
| 2005/0170593 A1 | 8/2005 | Kang et al. |
| 2005/0212080 A1 | 9/2005 | Wu et al. |
| 2005/0221591 A1 | 10/2005 | Bedell et al. |
| 2005/0224800 A1* | 10/2005 | Lindert et al. ................ 257/66 |
| 2005/0233598 A1 | 10/2005 | Jung et al. |
| 2005/0266698 A1 | 12/2005 | Cooney et al. |
| 2005/0280102 A1 | 12/2005 | Oh et al. |
| 2006/0038230 A1 | 2/2006 | Ueno et al. |
| 2006/0068553 A1 | 3/2006 | Thean et al. |
| 2006/0091481 A1 | 5/2006 | Li et al. |
| 2006/0091482 A1 | 5/2006 | Kim et al. |
| 2006/0091937 A1 | 5/2006 | Do |
| 2006/0105557 A1 | 5/2006 | Klee et al. |
| 2006/0128071 A1 | 6/2006 | Rankin et al. |
| 2006/0138572 A1 | 6/2006 | Arikado et al. |
| 2006/0151808 A1 | 7/2006 | Chen et al. |
| 2006/0153995 A1 | 7/2006 | Narwankar et al. |
| 2006/0166475 A1 | 7/2006 | Mantl |
| 2006/0214212 A1 | 9/2006 | Horita et al. |
| 2006/0258156 A1 | 11/2006 | Kittl |
| 2007/0001173 A1 | 1/2007 | Brask et al. |
| 2007/0004218 A1 | 1/2007 | Lee et al. |
| 2007/0015334 A1 | 1/2007 | Kittl et al. |
| 2007/0020827 A1 | 1/2007 | Buh et al. |
| 2007/0024349 A1 | 2/2007 | Tsukude |
| 2007/0026115 A1 | 2/2007 | van den Nieuwelaar et al. |
| 2007/0029576 A1 | 2/2007 | Nowak et al. |
| 2007/0048907 A1 | 3/2007 | Lee et al. |
| 2007/0063276 A1 | 3/2007 | Beintner |
| 2007/0076477 A1 | 4/2007 | Hwang et al. |
| 2007/0090416 A1* | 4/2007 | Doyle et al. ................ 257/288 |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0236278 A1 | 10/2007 | Hur et al. |
| 2007/0241414 A1 | 10/2007 | Narihiro |
| 2007/0247906 A1 | 10/2007 | Watanabe et al. |
| 2007/0254440 A1 | 11/2007 | Daval |
| 2008/0001171 A1 | 1/2008 | Tezuka et al. |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0227241 A1 | 9/2008 | Nakabayashi et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2008/0318392 A1 | 12/2008 | Hung et al. |

(56) References Cited

U.S. PATENT DOCUMENTS

| | | | |
|---|---|---|---|
| 2009/0026540 A1 | 1/2009 | Sasaki et al. | |
| 2009/0039388 A1 | 2/2009 | Teo et al. | |
| 2009/0066763 A1* | 3/2009 | Fujii et al. | 347/68 |
| 2009/0155969 A1 | 6/2009 | Chakravarti et al. | |
| 2009/0166625 A1 | 7/2009 | Ting et al. | |
| 2009/0181477 A1 | 7/2009 | King et al. | |
| 2009/0200612 A1 | 8/2009 | Koldiaev | |
| 2009/0239347 A1 | 9/2009 | Ting et al. | |
| 2009/0309162 A1 | 12/2009 | Baumgartner et al. | |
| 2009/0321836 A1 | 12/2009 | Wei et al. | |
| 2010/0155790 A1 | 6/2010 | Lin et al. | |
| 2010/0163926 A1* | 7/2010 | Hudait et al. | 257/190 |
| 2010/0183961 A1 | 7/2010 | Shieh et al. | |
| 2010/0187613 A1 | 7/2010 | Colombo et al. | |
| 2010/0207211 A1 | 8/2010 | Sasaki et al. | |
| 2010/0308379 A1 | 12/2010 | Kuan et al. | |
| 2011/0018065 A1* | 1/2011 | Curatola et al. | 257/368 |
| 2011/0108920 A1 | 5/2011 | Basker et al. | |
| 2011/0129990 A1 | 6/2011 | Mandrekar et al. | |
| 2011/0195555 A1 | 8/2011 | Tsai et al. | |
| 2011/0195570 A1 | 8/2011 | Lin et al. | |
| 2011/0256682 A1 | 10/2011 | Yu et al. | |
| 2012/0086053 A1 | 4/2012 | Tseng et al. | |

FOREIGN PATENT DOCUMENTS

| | | |
|---|---|---|
| CN | 101179046 | 5/2005 |
| CN | 1716576 | 1/2006 |
| CN | 1011459116 | 6/2009 |
| JP | 2002-57329 | 2/2002 |
| JP | 2003-243667 | 8/2003 |
| JP | 2005-12214 | 1/2005 |
| JP | 2005051241 | 2/2005 |
| JP | 2007-194336 | 8/2007 |
| KR | 10-2005-0096155 | 10/2004 |
| KR | 10-2005-0119424 | 12/2005 |
| KR | 1020070064231 | 6/2007 |
| TW | 497253 | 8/2002 |
| WO | WO 2004/068585 | 8/2004 |
| WO | WO2004090992 | 10/2004 |
| WO | WO 2007/046150 | 4/2007 |
| WO | WO2007/115585 | 10/2007 |

OTHER PUBLICATIONS

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

Shikida, Mitsuhiro, et al., "Comparison of Anisotropic Etching Properties Between KOH and TMAH Solutions", IEEE Xplore, Jun. 30, 2010, pp. 315-320.

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

Office Action dated Jul. 25, 2011 from corresponding application No. CN 201010243667.6.

Notice of Allowance of Patent dated Apr. 25, 2013 from corresponding application No. 10-2010-0071676 with English Translation.

Office Action dated Feb. 5, 2013 from corresponding application No. JP 2010-165061.

Office Action dated May 2, 2012 from corresponding application No. CN 201010196345.0.

Office Action dated May 4, 2012 from corresponding application No. CN 201010243667.6.

Office Action dated Jun. 20, 2012 from corresponding application No. CN 201010263807.6.

Office Action with English Translation from corresponding application No. KR 10-2010-0071676.

Office Action dated Aug. 23, 2013 from corresponding application No. TW099125304.

* cited by examiner

FIN STRUCTURE FOR HIGH MOBILITY MULTIPLE-GATE TRANSISTOR

CROSS-REFERENCE TO RELATED APPLICATIONS

The present application claims priority of U.S. application Ser. No. 61/230,403, filed on Jul. 31, 2009, which is incorporated herein by reference in its entirety.

The present application is related to U.S. patent application Ser. Nos. 12/707,788, filed on Feb. 18, 2010, titled MEMORY POWER GATING CIRCUIT AND METHODS; 12/758,426, filed on Apr. 12, 2010, titled FINFETS AND METHODS FOR FORMING THE SAME; 12/731,325, filed on Mar. 25, 2010, titled ELECTRICAL FUSE AND RELATED APPLICATIONS; 12/724,556, filed on Mar. 16, 2010, titled ELECTRICAL ANTI-FUSE AND RELATED APPLICATIONS; 12/757,203, filed on Apr. 9, 2010, titled STI STRUCTURE AND METHOD OF FORMING BOTTOM VOID IN SAME; 12/797,839, filed on Jun. 10, 2010, titled FIN STRUCTURE FOR HIGH MOBILITY MULTIPLE-GATE TRANSISTOR; 12/831,842, filed on Jul. 7, 2010, titled METHOD FOR FORMING HIGH GERMANIUM CONCENTRATION SiGeSTRESSOR; 12/761,686, filed on Apr. 16, 2010, titled FINFETS AND METHODS FOR FORMING THE SAME; 12/766,233, filed on Apr. 23, 2010, titled FIN FIELD EFFECT TRANSISTOR; 12/757,271, filed on Apr. 9, 2010, titled ACCUMULATION TYPE FINFET, CIRCUITS AND FABRICATIONMETHOD THEREOF; 12/694,846, filed on Jan. 27, 2010, titled INTEGRATED CIRCUITS AND METHODS FOR FORMING THE SAME; 12/638,958, filed on Dec. 14, 2009, titled METHOD OF CONTROLLING GATE THICKNESS IN FORMING FINFET DEVICES; 12/768,884, filed on Apr. 28, 2010, titled METHODS FOR DOPING FIN FIELD-EFFECT TRANSISTORS; 12/731,411, filed on Mar. 25, 2010, titled INTEGRATED CIRCUIT INCLUDING FINFETS AND METHODS FOR FORMING THE SAME; 12/775,006, filed on May 6, 2010, titled METHOD FOR FABRICATING A STRAINED STRUCTURE; 12/886,713, filed Sep. 21, 2010, (Docket Nos. TSMC2010-0646, T5057-B325), titled METHOD OF FORMING INTEGRATED CIRCUITS; 12/941,509, filed Nov. 8, 2010, titled MECHANISMS FOR FORMING ULTRA SHALLOW JUNCTION; 12/900,626, filed Oct. 8, 2010, titled TRANSISTOR HAVING NOTCHED FIN STRUCTURE AND METHOD OF MAKING THE SAME; 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

This invention relates generally to integrated circuits, and more particularly to FinFET and/or multigate FET devices with a fin structure.

BACKGROUND

As the integrated circuit device scale is further reduced, there are a few strategies to continuously enhance semiconductor device performance. One strategy is strain engineering. Performance benefits are achieved by modulating strain in the transistor channel, which enhances electron mobility (or hole mobility) and thereby conductivity through the channel.

In CMOS technologies, PMOS and NMOS respond differently to different types of strain. Specifically, PMOS performance is best served by applying compressive strain to the channel, whereas NMOS receives benefit from tensile strain. For example, SiGe ($Si_{1-x}Ge_x$), consisting of any molar ratio of silicon and germanium such as $Si_{0.3}Ge_{0.7}$, is commonly used as a semiconductor material in integrated circuits (ICs) as a strain-inducing layer (i.e. stressor) for strained silicon in CMOS transistors.

Strained silicon is a layer of silicon in which the silicon atoms are stretched beyond their normal interatomic distance. For example, this can be accomplished by putting the layer of silicon over a substrate of silicon germanium (SiGe). As the atoms in the silicon layer align with the atoms of the underlying silicon germanium layer which are arranged farther apart with respect to those of a bulk silicon crystal, the links between the silicon atoms become stretched—thereby leading to strained silicon.

Another strategy is using multigate devices. A multigate device or Multigate Field Effect Transistor (MuGFET) refers to a MOSFET that incorporates more than one gate into a single device. The multiple gates may be controlled by a single gate electrode where the multiple gate surfaces act electrically as a single gate, or by independent gate electrodes. A multigate device employing independent gate electrodes is sometimes called a Multiple Independent Gate Field Effect Transistor (MIGFET).

In a multigate device, the channel is surrounded by more than one gate on multiple surfaces, allowing more effective suppression of "off-state" leakage current. Multiple gates also allow enhanced current in the "on" state, also known as drive current. The higher contrast between on/off states and reduced leakage current results in lower power consumption and enhanced device performance. Non-planar devices are also more compact than conventional planar transistors, enabling higher transistor density that translates to smaller overall integrated circuits.

Despite the above strategies, still further improvements and better performances including higher carrier mobility are desirable. More particularly, higher strain by SiGe/Ge strained-device is desirable, but it is difficult to make a high tensile Ge device. Also, a poor interface between gate dielectric and Ge of NMOS device is problematic.

Accordingly, new structures and methods for better device performance including higher carrier mobility and better interface between gate dielectric and Ge of an NMOS device are desired.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A structure of and method to fabricate high mobility strained-Ge or strained-SiGe FinFET and Multigate Field Effect Transistor (MuGFET), e.g., Double-Gate FETs or Tri-Gate FETs on Si substrate with III-V capping layer, is provided. Throughout the various views and illustrative embodiments of the present invention, like reference numbers are used to designate like elements.

Figure 1:
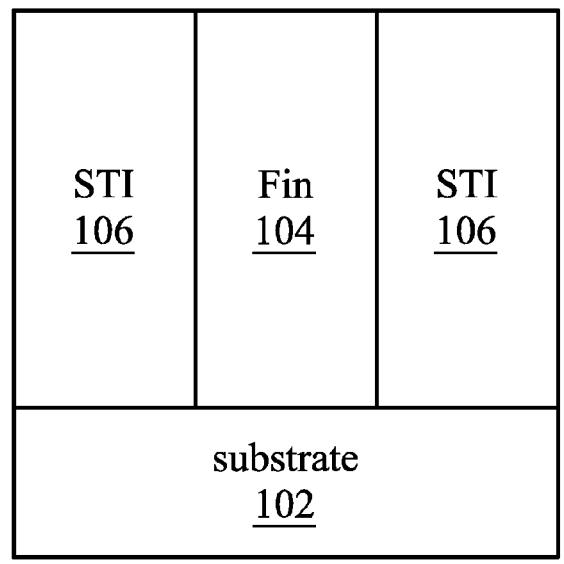
FIG. 1 illustrates a cross section at a transistor gate area of a vertical fin structure for FinFET and/or MuGFET with strained-Ge or strained-SiGe in the process of fabrication.

FIG. 1 illustrates a cross section at a transistor gate area of a vertical fin structure for FinFET and/or MuGFET with strained-Ge or strained-SiGe in the process of fabrication. The semiconductor substrate 102 comprises group IV semiconductor material, e.g., Si, Ge, SiGe, or SiC, or any other suitable material. The fin layer 104 comprises group IV semiconductor material, e.g., Ge, SiGe, SiC, or any combinations thereof, or any other suitable material. The shallow trench isolation (STI) 106 provides isolation from adjacent devices and prevents electrical current leakage between adjacent semiconductor device components.

STI 106 can be created before transistors are formed during the semiconductor device fabrication process. The key steps of the STI process involve etching a pattern of trenches, depositing one or more dielectric materials (e.g. silicon dioxide) to fill up the trenches, and removing the excess dielectric using a technique such as chemical-mechanical planarization. In FIG. 1, STI 106 is formed first and then etched out for the fin layer 104 (e.g., Ge, SiGe, SiC, or any combinations thereof) deposition. Alternatively, after the fin layer 104 is deposited, trenches can be etched out so that dielectric materials can fill up the trenches to form the STI 106.

Figure 2:
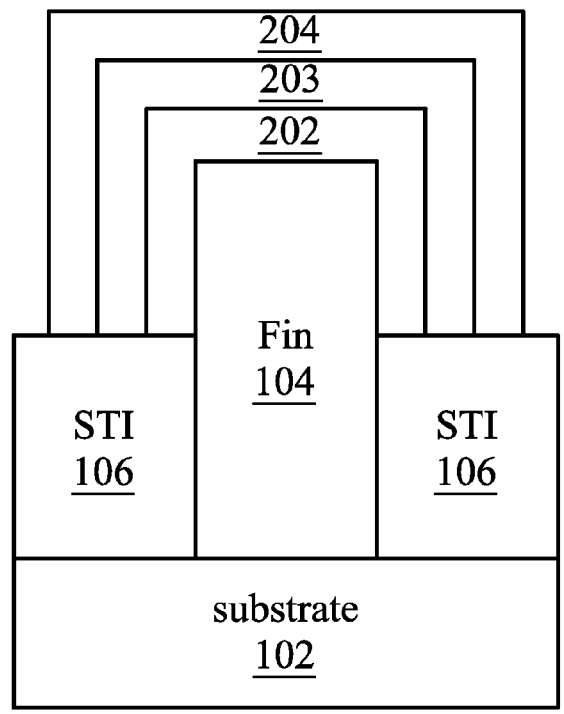
FIG. 2 illustrates a cross section at a transistor gate area of a vertical fin structure for FinFET and/or MuGFET with strained-Ge or strained-SiGe with a III-V capping layer.

FIG. 2 illustrates a cross section at a transistor gate area of a vertical fin structure for FinFET and/or MuGFET with strained-Ge or strained-SiGe with a III-V capping layer. Compared to FIG. 1, the STI 106 is etched to expose the fin layer 104 for further device fabrication. A capping layer 202 is deposited overlaying the fin layer 104. The capping layer 202 surrounds the fin layer 104 around the transistor channel in the transistor gate area. The capping layer 202 comprises a compound of group III-V semiconductor, e.g., GaAs, InGaAs, InAs, InSb, GaSb, GaN, InP, or any combinations thereof, or any other suitable material. More particularly, due to lattice matching, an InGaAs capping layer 202 can be used with a Ge fin layer 104, or a GaAs capping layer 202 can be used with SiGe fin layer 104, for example.

The lattice mismatch between the capping layer 202 and the substrate 102 is higher than the lattice mismatch between the fin layer 104 and the substrate 102. For example, the lattice mismatch between an InGaAs capping layer 202 and a Si substrate 102 is higher than the 4 percent lattice mismatch between Ge fin layer 104 and Si substrate 102. Due to the higher mismatch that is induced by using the III-V compound capping layer 202, the capping layer 202 applies strain on the fin layer 104. When the fin layer 104 functions as a channel of the semiconductor transistor, this strain enhances mobility through the tensile-strained fin layer 104 (e.g., Ge), thus achieving higher mobility in the channel.

For example, compared to the electron mobility of 4000 $cm^2/V \cdot s$ of Ge, 1400 $cm^2/V \cdot s$ of Si, or 8500 $cm^2/V \cdot s$ of GaAs, 1.5 percent tensile-strained Ge exhibits about 12000 $cm^2/V \cdot s$. Also, the hole mobility of 1.5 percent tensile-strained Ge is about 20000 $cm^2/V \cdot s$, compared to 2000 $cm^2/V \cdot s$ of Ge, 450 $cm^2/V \cdot s$ of Si, or 400 $cm^2/V \cdot s$ of GaAs. Therefore, the structure shown in FIG. 2 provides a high speed CMOS channel by having a III-V semiconductor compound capping layer 202 on top of the fin layer 104.

Further, a high-k gate dielectric layer 203 can be deposited above the capping layer 202. The III-V semiconductor compound capping layer 202 functions as a buffer and provides a better interface between the high-k gate dielectric layer and the fin layer 104, compared to the poor interface between the high-k gate dielectric layer and Ge fin layer 104, for example. This is due to the material property, i.e., the interface defect density (Dit) of gate dielectric on InGaAs is much lower than that on Ge, for example. Moreover, a metal gate layer 204 can be deposited over the high-k gate dielectric layer 203.

The advantageous features of the present invention include high tensile strain FinFET and multigate FET devices due to the higher lattice mismatch explained above, resulting in a very high mobility channel by using larger lattice constant material. Also, the gate dielectric interface is improved by using the III-V capping layer for Ge and high Ge content SiGe device. A skilled person in the art will appreciate that there can be many embodiment variations of this invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A vertical fin structure for a semiconductor transistor comprising:
   a semiconductor substrate;
   a fin layer on top of and in direct contact with the semiconductor substrate; and
   a capping layer overlaying the fin layer,
   wherein the semiconductor substrate comprises a group IV semiconductor material, the fin layer comprises a group IV semiconductor material, the capping layer comprises a semiconductor compound from group III-V, the fin layer functions as a channel of the semiconductor transistor, and the capping layer applies strain on the fin layer to enhance mobility through the channel by a difference between a first lattice mismatch between the capping layer and the semiconductor substrate and a second lattice mismatch between the fin layer and the semiconductor substrate.

2. The vertical fin structure of claim 1, wherein the fin layer comprises Ge, SiGe, SiC, or any combinations thereof.

3. The vertical fin structure of claim 1, wherein the semiconductor substrate comprises Si, Ge, SiGe, or SiC.

4. The vertical fin structure of claim 1, wherein the capping layer comprises GaAs, InGaAs, InAs, InSb, GaSb, GaN, InP, or any combinations thereof.

5. The vertical fin structure of claim 1, wherein the first lattice mismatch between the capping layer and the semiconductor substrate is more than 4 percent.

6. The vertical fin structure of claim 1, wherein the fin layer is in between shallow trench insulation (STI) layers that provide isolation from adjacent devices.

7. The vertical fin structure of claim 1, further comprising a high-k dielectric layer overlaying the capping layer.

8. The vertical fin structure of claim 7, further comprising a metal gate layer overlaying the high-k dielectric layer.

9. A method to fabricate a vertical fin structure for a semiconductor transistor, comprising:
    providing a semiconductor substrate wherein the semiconductor substrate comprises a group IV semiconductor material;
    depositing a fin layer on top of and in direct contact with the semiconductor substrate wherein the fin layer comprises group IV semiconductor material and functions as a channel of the semiconductor transistor; and
    depositing a capping layer overlaying the fin layer shape wherein the capping layer comprises semiconductor compound from group III-V and applies strain on the fin layer to enhance mobility through the channel by a difference between a first lattice mismatch between the capping layer and the semiconductor substrate and a second lattice mismatch between the fin layer and the semiconductor substrate.

10. The method of claim 9, wherein the fin layer comprises Ge, SiGe, SiC, or any combinations thereof.

11. The method of claim 9, wherein the semiconductor substrate comprises Si, Ge, SiGe, or SiC.

12. The method of claim 9, wherein the capping layer comprises GaAs, InGaAs, InAs, InSb, GaSb, GaN, InP, or any combinations thereof.

13. The method of claim 9, wherein the first lattice mismatch between the capping layer and the semiconductor substrate is more than 4 percent.

14. The method of claim 9, further comprising:
    depositing a shallow trench insulation (STI) layer that provides isolation from adjacent devices prior to depositing the fin layer; and
    etching the STI layer to provide space for the fin layer.

15. The method of claim 9, further comprising depositing a high-k dielectric layer overlaying the capping layer.

16. The method of claim 15, further comprising depositing a metal gate layer overlaying the high-k dielectric layer.

17. A vertical fin structure for a semiconductor transistor comprising:
    a semiconductor substrate;
    a fin layer on top of and in direct contact with the semiconductor substrate; and
    a capping layer overlaying the fin layer,
    wherein
    the semiconductor substrate comprises Si, Ge, SiGe, or SiC;
    the fin layer comprises Ge, SiGe, SiC, or any combinations thereof;
    the capping layer comprises GaAs, InGaAs, InAs, InSb, GaSb, GaN, InP, or any combinations thereof;
    a first lattice mismatch between the capping layer and the semiconductor substrate is more than 4 percent;
    the fin layer functions as a channel of the semiconductor transistor; and
    the capping layer applies strain on the fin layer to enhance mobility through the channel by a difference between the first lattice mismatch between the capping layer and the semiconductor substrate and a second lattice mismatch between the fin layer and the semiconductor substrate.

18. The vertical fin structure of claim 17, wherein the fin layer is in between shallow trench insulation (STI) layers that provide isolation from adjacent devices.

19. The vertical fin structure of claim 17, further comprising a high-k dielectric layer overlaying the capping layer.

20. The vertical fin structure of claim 17, further comprising a metal gate layer overlaying the high-k dielectric layer.

21. The vertical fin structure of claim 1, wherein the first lattice mismatch between the capping layer and the semiconductor substrate is higher than the second lattice mismatch between the fin layer and the semiconductor substrate.

* * * * *